June 2, 1959 W. MOORE, JR 2,889,496

ELECTRICAL CONTROL APPARATUS

Filed July 9, 1954 2 Sheets-Sheet 1

INVENTOR.
WARREN MOORE JR.
BY Arthur H. Swanson
ATTORNEY.

June 2, 1959 W. MOORE, JR 2,889,496

ELECTRICAL CONTROL APPARATUS

Filed July 9, 1954 2 Sheets-Sheet 2

INVENTOR.
WARREN MOORE JR.

BY Arthur H. Swenson

ATTORNEY.

United States Patent Office 2,889,496

Patented June 2, 1959

2,889,496

ELECTRICAL CONTROL APPARATUS

Warren Moore, Jr., North Hills, Pa., assignor to Minneapolis-Honeywell Regulator Company, Minneapolis, Minn., a corporation of Delaware Application July 9, 1954, Serial No. 442,263

12 Claims. (Cl. 317—146)

A general object of the present invention is to provide a new and improved vane controlled oscillator which may be useful in controlling the magnitude of a regulated variable. More specifically, the present invention is concerned with a vane controlled oscillator type controller incorporating transistors as the oscillation producing element and transistors as amplifiers for the output of the oscillation producing portion of the apparatus.

Vane controllers are widely used in industry for regulating magnitudes of controlled variables. The most conventional form of vane controller is one which has a unidirectional input signal which is applied to a galvanometer coil, the unidirectional signal being proportional to the magnitude of some measured variable. The galvanometer coil generally carries an arm with a vane attached thereto and this vane is used to vary the tuning of an impedance element associated with an oscillator. The tuning of the impedance element will determine whether or not the associated oscillator circuit will sustain oscillations or will go out of oscillation. As the current required for the oscillator to sustain oscillations is different than the current drawn by the oscillator section when not oscillating, it is possible to place a control relay in the power supply circuit for the oscillator to sense the presence or absence of oscillations. The controlled relay in turn may be used to regulate the magnitude of the variable affecting the input.

It has been found that transistors are well adapted for use in certain types of oscillating circuits. While the oscillator circuits incorporating transistors have the obvious advantage of reduction in size, there is also an accompanying improvement in the dependability of the circuit as well as in increase in the overall life expectancy of the circuit.

Another problem arising in connection with the use of transistors in an oscillator circuit is a suitable way of obtaining an output control signal from the oscillator without disturbing the oscillating characteristics of the same. The oscillator circuit of the present invention is well adapted for obtaining an output control signal without disturbing the oscillation portion of the apparatus. In some instances it is also desirable to obtain additional amplification of the output control signal and this amplification is readily achieved with the present form of oscillator circuit.

It is therefore a more specific object of the present invention to provide a transistor oscillator using a resonant input and output circuit with a vane controlled coupling element between the two.

Another more specific object of the present invention is to provide a new and improved transistor amplifier for the output of a transistor oscillator, said amplifier being arranged to receive a signal bias from the direct current component of the collector current of the oscillator flowing through the transistor amplifier.

A still more specific object of the present invention is to provide a new and improved transistor oscillator circuit having a resonant input and output circuit with power supplied thereto by way of the input and output circuits.

The various features of novelty which characterize the invention are pointed out with particularity in the claims annexed to and forming a part of this specification. For a better understanding of the invention, its advantages, and specific objects attained with its use, reference should be had to the accompanying drawings and descriptive matter in which there is illustrated and described preferred embodiments of the invention.

Figure 1:
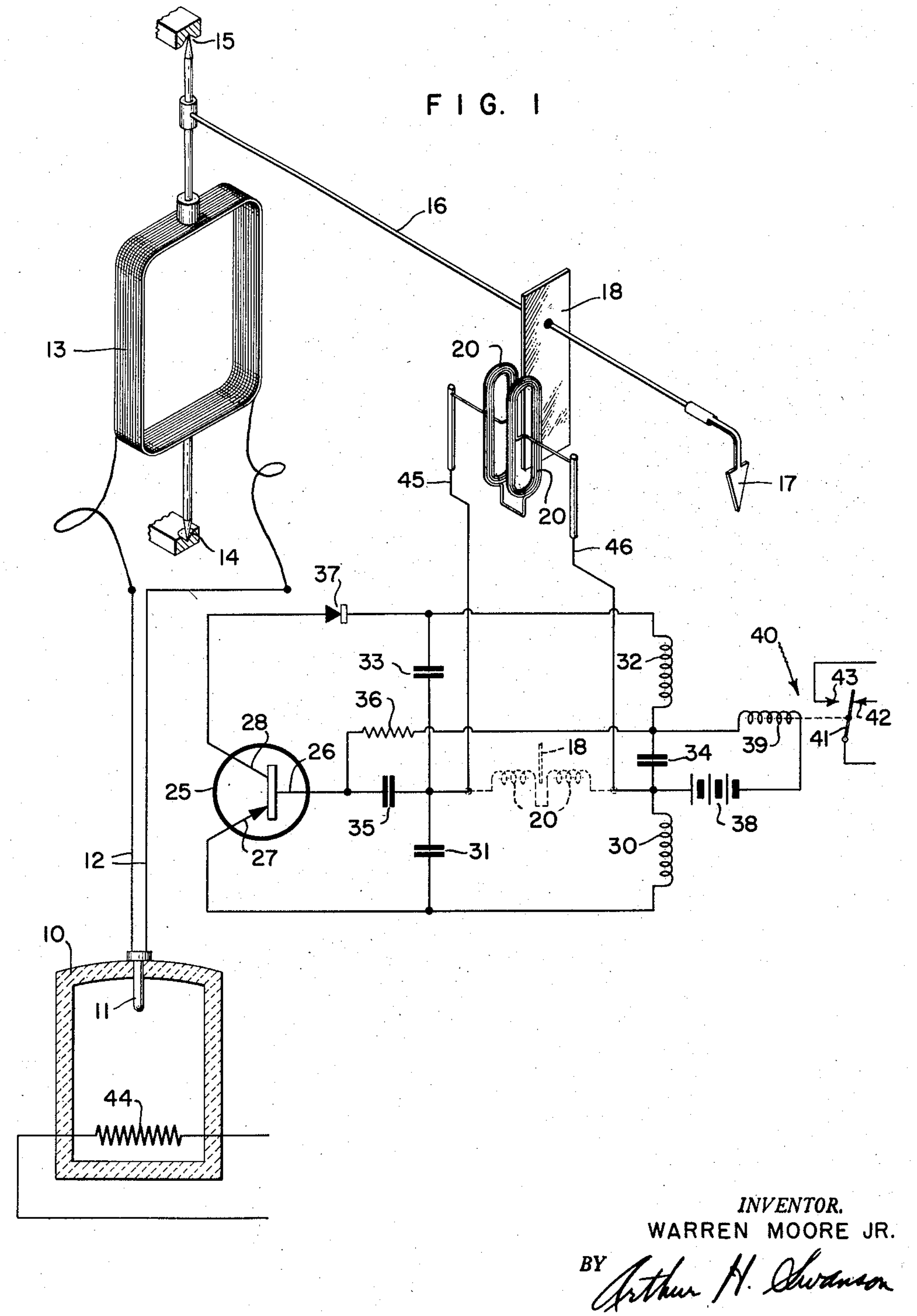
Fig. 1 shows the basic form of vane controller apparatus used in the present invention.

Referring first to Fig. 1, the numeral 10 represents a furnace wherein it is desired to sense the temperature by means of a thermocouple or other similar device 11. The output of the thermocouple 11 is fed by way of leads 12 to the coil 13 of a galvanometer. The coil 13 is adapted to cooperate with a permanent magnet assembly, not shown, and produce rotation of the coil about pivots 14 and 15 in accordance with the input signal to the coil. Carried by the coil is an arm 16 having a pointer 17 on the outer end thereof. Also carried by the arm 16 is a vane 18 which is adapted to be moved between a pair of coils 20 and to change the inductance of the coils.

The oscillator portion of the apparatus includes a transistor 25 having a base electrode 26, an emitter electrode 27, and a collector electrode 28. Forming an input resonant circuit for the transistor 25 is a coil 30 and a condenser 31. Forming a resonant circuit on the output of the transistor is a further coil 32 and a condenser 33. These resonant circuits are adapted to be coupled together by the coils 20 and are effectively coupled when the vane 18 is not between the coils. Connected between the coils 32 and 30 as a direct current blocking means is a condenser 34. Coupled between the coils 20 and the base electrode 26 is a further condenser 35. For establishing a direct current bias circuit for the base electrode 26, there is provided a resistor 36. Connected in series with the collector electrode 28 is a suitable junction diode 37.

The power supply for the transistor circuit is derived from a battery 38 or some other suitable direct current power source. In series with the battery 38 is a coil 39 of a relay 40. This relay also includes a switch blade 41, normally biased into engagement with associated contact 42 when the coil 39 is deenergized. When the coil is energized, the blade 41 is normally biased into engagement with a contact 43. When the blade 41 is engaging contact 43, it may be used to close an energizing circuit to a heater 44 associated with the furnace 10.

In considering the operation of the apparatus of Fig. 1 the operation will first be considered when the vane 18 is not between the coils 20. When this condition is present, the coils 20 will present a relatively high impedance between their input terminals at 45 and 46. With this high impedance between the terminals 45 and 46, there is a coupling means between the output resonant tank circuit formed by the condenser 33 and coil 32 and the input tank circuit comprising condenser 31 and coil 30. With the coupling between the two resonant circuits, there will be a feedback signal to the input or base electrode 26 and the circuit will be effective to sustain oscillations. The current flow for the transistor may be traced from the positive terminal of the batttery 38 through the coil 30 of the input resonant tank circuit to emitter electrode 27, collector electrode 28, diode 37, coil 32 of the output resonant tank circuit, and coil 39 back to the negative terminal of the battery 38. The emitter-base diode 27—26 serves to rectify the oscillatory signal in the emitter-base path and establishes a charge on condenser 35 which biases the base so that the current flow in the emitter-collector path is low in magnitude. By proper selection of the circuit constants, the oscillator will be drawing an average amount of direct current from the battery 38 which will be less than that necessary to energize the relay coil 39 so that the blade 41 will not be moved into engagement with contact 43.

When the vane 18 moves between the coils 20 the impedance of the coils between the terminals 45 and 46 decreases to the point where there is no effective coupling between the output resonant circuit formed by the condenser 33 and coil 32 and the input resonant tank circuit formed by the condenser 31 and coil 30. As a consequence, the circuit will no longer be oscillating and the amount of current drawn by the transistor 25 will be dependent upon the biasing voltage applied thereto by way of the resistor 36 to the base electrode 26. As the base electrode 26 is effectively connected to the negative side of the power supply 38 by way of relay coil 39, this bias will be sufficient to cause an increase in the amount of current flowing through the emitter and collector electrode circuit of the transistor 25. Thus, there will be sufficient current flowing through the relay coil 39 to energize the relay so that switch blade 41 moves into engagement with the contact 43. The closing of contact 43 with blade 41 may be used to energize heater 44 in the furnace 10.

Figure 2:
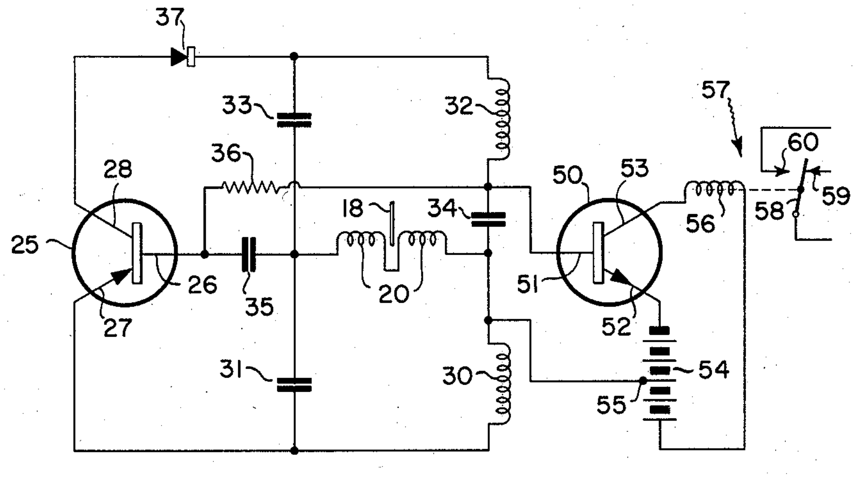
Fig. 2 shows the oscillator circuit arranged to have the output thereof amplified by a transistor amplifier.

*Figure 2*

The oscillator circuit of Fig. 2 is the same as that of Fig. 1 and corresponding components carry corresponding reference characters. Added to the circuit of Fig. 2 is an amplifier in the form of a transistor 50 having a base electrode 51, an emitter electrode 52, and a collector electrode 53. A battery 54 is connected to supply power to the oscillator section as well as the amplifier transistor 50, the oscillator section being supplied from a tap 55 on the battery 54. In series with the battery 54 and the transistor 50 output circuit is a relay coil 56 of a control relay 57. The relay 57 also includes a switch blade 58 normally biased, by means not shown, into engagement with an associated contact 59 and adapted to be moved into engagement with a contact 60 when the coil 56 has sufficient current flowing therethrough.

In the circuit of Fig. 2 the current for the oscillator transistor 25 is supplied by the battery 54 in a circuit that may be traced from the tap 55 through coil 30, emitter electrode 27, collector electrode 28, junction diode 37, coil 32, base electrode 51, and emitter electrode 52 of the transistor 50 back to the negative terminal of the battery 54. The current flow in this last traced circuit through the transistor 50, by way of the base electrode 51 and emitter electrode 52, will regulate the amount of current flowing in the emitter and collector electrode circuit of the transistor 50. Thus, when the oscillator is oscillating, a relatively low amount of current will be drawn from the battery 54 as explained in connection with Fig. 1, and therefore a small amount of current will be flowing through the base electrode 51 and emitter electrode 52. With a small amount of current in the input circuit to the transistor 50, there will be a relatively small amount of current flowing in the output circuit including the emitter electrode 52 and collector electrode 53 so that the relay 56 will remain deenergized with the blade 58 engaging contact 59.

When the oscillator circuit is not oscillating, a large amount of current will be drawn by the transistor 25 and this large current flow through the base electrode 51 and emitter electrode 52 will cause a large amount of current to flow through the transistor 50 between the emitter electrode 52 and collector electrode 53 so that the relay coil 56 will have sufficient current flowing therethrough to move the blade 58 into engagement with the contact 60.

Figure 3:
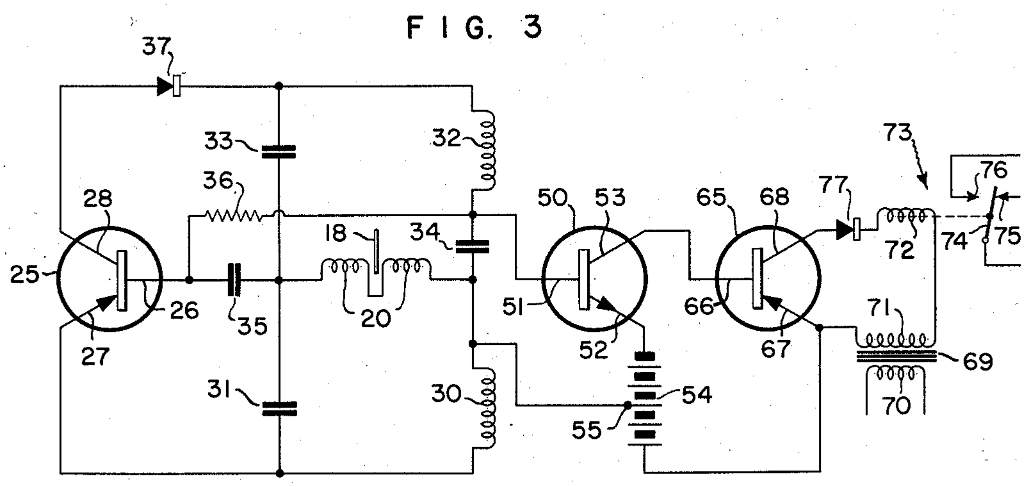
Fig. 3 represents a further form of the apparatus using a pair of transistors as amplifiers in the output of the circuit.

*Figure 3*

The oscillator circuit of Fig. 3 is the same basic oscillator circuit of Fig. 1 and also includes the first stage of amplification shown in Fig. 2. In Fig. 3, components corresponding to those of Figs. 1 and 2 carry corresponding reference characters.

Added to the circuit of Fig. 3 is an additional transistor amplifier 65 comprising a base electrode 66, an emitter electrode 67, and a collector electrode 68. Supplying power to this transistor is a transformer 69 having a primary winding 70 which may be connected to a suitable source of alternating current and a secondary winding 71. In series with the secondary 71 is a relay coil 72 of a control relay 73. The control relay 73 also includes a switch blade 74 normally biased, by means not shown, into engagement with a contact 75. When the coil 72 is energized, the blade 74 is moved into engagement with an associated contact 76. In series with the coil 72 is a suitable junction diode 77.

The operation of Fig. 3 is basically the same as that of Fig. 2 insofar as the oscillator and the amplifier transistor 50 are concerned. In the present figure the output current from the transistor 50 may be traced from the positive terminal of the battery 54 through emitter electrode 67 of transistor 65, base electrode 66, collector electrode 53 of transistor 50, emitter electrode 52 back to the negative terminal of the battery 54. The current flow in the last traced circuit will regulate the current flowing in the transistor 65 between the emitter electrode 67 and the collector electrode 68. When there is a large amount of current flowing in the last traced circuit, the current output of the transistor 65 during the positive half cycle of the power supply transformer 69 will be large. The current flow circuit for the transistor 65 in its output circuit may be traced from the left hand terminal of the secondary winding 71 through emitter electrode 67, collector electrode 68, junction diode 77, relay coil 72 back to the other terminal of the secondary 71.

With sufficient current flowing through the output circuit of the transistor 65, the relay coil 72 will move the switch blade 74 into engagement with contact 76. If the current flow conditions should be reversed by the oscillator going into oscillation, the output current from the transistor 50 as well as the output current from the transistor 65 will be decreased and the relay coil will not have sufficient current flowing therethrough to move the blade into engagement with contact 76. This particular circuit of Fig. 3 is well adapted for use with a power transistor in the output which is used to control a relay with a relatively large current handling capacity.

While, in accordance with the provisions of the statutes, there has been illustrated and described the best forms of the embodiments of the invention known, it will be apparent to those skilled in the art that changes may be made in the forms of the apparatus without departing from the spirit of the invention as set forth in the appended claims and that in some cases certain features of the invention may be used to advantage without a corresponding use of other features.

Having now described my invention, what I claim as new and desire to secure by Letters Patent is:

1. A transistor oscillator comprising, a transistor having a base electrode, emitter electrode, and collector electrode, a direct current power source means for energizing said transistor, a parallel resonant output circuit connected between said base electrode and said collector electrode, a parallel resonant input circuit connected between said emitter electrode and said base electrode, and a feedback coupling impedance comprising an inductor element connected as a common element of said output and input parallel resonant circuits.

2. A transistor oscillator comprising, a transistor having a base electrode, emitter electrode, and collector electrode, a parallel resonant output circuit connected between said base electrode and said collector electrode, a parallel resonant input circuit connected between said emitter electrode and said base electrode, a direct current power source connected to said emitter electrode through said input resonant circuit and to said collector electrode through said output resonant circuit, and a feedback coupling impedance comprising a variable inductor element connected as a common element of said output and input resonant circuits.

3. A transistor oscillator comprising, a transistor having a base electrode, emitter electrode, and collector electrode, a resonant output circuit connected between said base electrode and said collector electrode, a resonant input circuit connected between said emitter electrode and said base electrode, a direct current power supply for said oscillator having negative and positive terminals, means connecting said negative terminal to said collector electrode through said output resonant circuit and said positive terminal to said emitter electrode through said input resonant circuit, and a resistor directly connecting said negative terminal of said power supply to said base electrode independently of said resonant circuits.

4. A vane controlled oscillator circuit comprising, a transistor having a base electrode, emitter electrode, and collector electrode, a direct current power source means for energizing said transistor, a vane controlled inductive element connected to said base electrode, an input inductive element connected to said emitter electrode, an output inductive element connected to said collector electrode, means connecting all of said inductive elements at the ends opposite their connection to the respective electrodes to a common point, a first condenser connected between said base electrode and said collector electrode to form with said output inductance a first resonant circuit, and a second condenser connected between said base electrode and said emitter electrode to form with said input inductance a second resonant circuit, said vane controlled inductance comprising a common element of and forming a variable coupling impedance between said first and second resonant circuits to control the feedback and presence or absence of oscillation in said oscillator circuit.

5. A vane controlled oscillator circuit comprising, a transistor having a base electrode, emitter electrode, and collector electrode, a vane controlled inductive element connected to said base electrode, an input inductive element connected to said emitter electrode, an output inductive element connected to said collector electrode, means connecting all of said inductive elements at the ends opposite their connection to the respective electrodes to a common point, a first condenser connected between said base electrode and said collector electrode to form with said output inductance a first resonant circuit, a second condenser connected between said base electrode and said emitter electrode to form with said input inductance a second resonant circuit, said vane controlled inductance comprising a common element of and forming a variable coupling impedance between said first and second resonant circuits to control the feedback and presence or absence of oscillation in said oscillator circuit, a third condenser connected between said common point and said output inductive element, and a source of power connected to each side of said condenser to supply an operating potential for said transistor.

6. Apparatus as defined in claim 5 wherein said source of power has a control relay coil in series therewith.

7. Apparatus as defined in claim 5 wherein said source of power has an amplifying transistor control circuit in series therewith.

8. A vane controller comprising, a selectively operable oscillator responsive to the position of a movable vane, a transistor amplifier connected to said oscillator, said transistor amplifier having an input means in series with a power supply circuit to said oscillator, and a control relay in series with an output circuit of said transistor amplifier, said output circuit including power supply means.

9. A vane controller comprising, a selectively operable oscillator responsive to the position of a movable vane, a power source, a transistor having a base electrode, emitter electrode, and collector electrode, means connecting said power source to said oscillator circuit through the emitter electrode and base electrode path of said transistor, return connection means directly connected between said oscillator and said power source, and control means connecting said power source to the emitter and collector electrodes of said transistor.

10. Apparatus as defined in claim 9 wherein said control means is a control relay.

11. Apparatus as defined in claim 9 wherein said control means is a second transistor.

12. Apparatus as defined in claim 11 wherein said second transistor has a base electrode, emitter electrode and collector electrode with the base and emitter electrodes in series with the power source through the emitter-collector path of said first mentioned transistor, and with the emitter and collector electrodes in series with a second source of power.

References Cited in the file of this patent

UNITED STATES PATENTS

| | | |
|---|---|---|
| 2,559,266 | Wannamaker | July 3, 1951 |
| 2,564,937 | Wannamaker | Aug. 21, 1951 |
| 2,579,336 | Rack | Dec. 18, 1951 |
| 2,584,990 | Dimond | Feb. 12, 1952 |
| 2,592,683 | Gray | Apr. 15, 1952 |
| 2,619,620 | Tapp et al. | Nov. 25, 1952 |
| 2,653,279 | Ehret et al. | Sept. 22, 1953 |
| 2,663,806 | Darlington | Dec. 22, 1953 |
| 2,727,146 | Fromm | Dec. 13, 1955 |
| 2,762,464 | Wilcox | Sept. 11, 1956 |

FOREIGN PATENTS

| | | |
|---|---|---|
| 697,168 | Great Britain | Sept. 16, 1953 |

OTHER REFERENCES

Publication "Duality as Guide in Transistor Circuit Design," by Wallace and Raisbeck, 37 pages.

"Radio-Craft," September 1948. Pages 24–25.